United States Patent [19]

Torres

[11] Patent Number: 4,918,392
[45] Date of Patent: Apr. 17, 1990

[54] POLARITY TESTER FOR DEVICES INCORPORATING SOCKET MEANS FOR POWER TRANSMISSION TO ACTIVE ELEMENTS

[76] Inventor: Peter K. Torres, 348 Lincoln Ave., North Dighton, Mass. 02764

[21] Appl. No.: 293,361

[22] Filed: Jan. 4, 1989

[51] Int. Cl.$^4$ ............................................. G01R 31/02
[52] U.S. Cl. ................................... 324/537; 324/542; 324/66; 324/133
[58] Field of Search ................... 324/149, 158 P, 508, 324/542, 537, 133, 66

[56] References Cited

U.S. PATENT DOCUMENTS

| | | |
|---|---|---|
| 2,229,927 | 1/1941 | Kamper . |
| 2,806,203 | 9/1957 | Church . |
| 3,723,863 | 3/1973 | Myers . |
| 3,851,243 | 11/1974 | Banner . |
| 4,027,236 | 5/1977 | Stewart . |
| 4,074,187 | 2/1978 | Miller ................................... 324/66 |
| 4,258,313 | 3/1981 | Cheatham ........................... 324/133 |
| 4,437,054 | 3/1984 | Swift ................................... 324/508 |
| 4,575,588 | 3/1986 | Vyver .................................. 324/66 |

FOREIGN PATENT DOCUMENTS 2644134 4/1978 Fed. Rep. of Germany ........ 324/66

OTHER PUBLICATIONS

Stumbles: "Multiway Circuit Tester"—New Electronics, Mar. 1978—p. 16.

Primary Examiner—Reinhard J. Eisenzopf
Assistant Examiner—Jose M. Solis
Attorney, Agent, or Firm—Jerry Cohen; Robert P. Cogan

[57] ABSTRACT

A self-contained polarity tester (1) tests connection within a device (40), e.g. a lamp fixture, of a power input plug (41) to a socket (53). A tester body (3) has a polarized receptacle (10) which receives the plug (41). A probe (20) mounted to the tester body (3) is moved by an operator to engage the socket (53). A low-level power source (35) in a circuit in the tester (1) is connected to energize one of a plurality of indicator devices (16, 17) dependent upon the polarity of the connection of the plug (41). Illumination of neither indicator device (16, 17) or both is indicative of a short or open circuit respectively.

14 Claims, 2 Drawing Sheets

POLARITY TESTER FOR DEVICES INCORPORATING SOCKET MEANS FOR POWER TRANSMISSION TO ACTIVE ELEMENTS

BACKGROUND OF THE INVENTION

The present invention relates to polarity testers in electrical circuits, and more particularly to polarity testers for devices providing power outputs through socket means.

Many forms of devices require polarity testing to determine that they have been properly assembled. The present invention is particularly suited for use to test polarity in a device which receives input power through a plug and transmits power through an output socket to an active element. An example of such a device is a table lamp, or more rigorously speaking from an electromechanical standpoint, a lamp fixture. Different forms of polarity testing have different purposes. In some cases, the device to be tested will be supplying power to polarity-sensitive devices. In other cases, it is necessity to see that alternating current is connected properly to a circuit to minimize shock hazard.

The context for utilization of the present invention is found primarily in the context of testing of devices for connection to domestic current. For operation of virtually all electrical appliances other than heaving apparatus performing heating or cooing function, alternating current is supplied to homes in a two wire configuration for 110 volt service referred to as line current hereafter. The three wires are often referred to as the "plus 110 volt", ground, and "neutral" lines, with the plus and neutral lines being referred to as the "hot" lines.

Devices designed for connection to line current are configured with lines cords comprising first and second lead wires having a first end connected to a plug and a second end connected to first and second respective terminals in the device. It is desirable for best operation, and also necessary for compliance with electrical codes, that a selected one of the lead wires be connected to a hot wire, and a second of the lead wires is connected to neutral. To this end, polarized plugs are utilized in conjunction with polarized line current outlets. One blade of the plug is wider than the other, and one slot in the receptacle is wider than the other so that the plug can only have one preselected juxtaposition with the receptacle. Since a preselected plug blade can provide connection to only one wire in the receptacle, the connection of the second ends of the lead wires determines to polarity of current provided to the device. If the wires are connected in a desired, first of two possible ways to the terminals, they are said to be connected in a first polarity. If they are reversed, they are connected in a second, or wrong, polarity.

Prior art polarity testing systems to test the connection of power lines to the receptacles into which the plug will be connected are well-known in the art. In such systems, line power is connected to energize selected indicator lamps in correspondence with the polarity of power at the receptacle. These devices are suited for connection to receptacles, but not suited for connection to a power output from a connecting means, such as a lamp socket, for mechanically supporting and electrically transmitting power to an active device, such as a lamp, which connecting means is connected in series to a receptacle. U.S. Pat. No. 4,437,054 issued Mar. 13, 1984 discloses an adapter for interfacing a power receptacle polarity tester to a lamp holder. This requires the additional complexity in testing apparatus of both an adapter and a line current tester. To perform the polarity test, the lamp holder is connected to line current. This is the same line current from which t is desired to protect the ultimate user of the device. U.S. Pat. No. 4,258,313 issued Mar. 24, 1981 discloses a hand-held tool for testing lamp circuit polarity. This apparatus also contemplates connection of a device to line current while it is employed. Continuity checkers are well-known in the art, but are not configured to respond in a preselected manner to a preselected polarity and are not mechanically configured to interconnect conveniently with a socket. Significant manipulation to interface the tester to a socket may be required, leading to inefficiency and inconvenience in operation. Further, neither of these references discloses test for short circuits.

SUMMARY OF THE INVENTION

It is therefore an object of the present invention to provide polarity testing means suited for utilization with a device having a plug for receiving input power and means for mechanically receiving and for electrical connection in a preselected polarity to an active element which are convenient to use and which do not require connection to the input power source for the device.

It is an additional object of the present invention to provide a self-contained polarity tester of the type described in which the testing for polarity includes a test for a short or open circuit in the device under test.

It is a more particular object of the present invention to provide a self-contained polarity tester for lamp fixtures including a receptacle for receiving a line cord plug from a lamp fixture and having a probe for insertion in a lamp socket, and which polarity indicator means are operated by a safe, low level source.

It is also a particular object of the present invention, in one form, to provide a polarity tester comprising modular probe means whereby the tester may be conveniently used any preselected lamp socket configuration.

It is a further object of the present invention, in one form, to provide for selectable fixed spatial relationship of the probe to a tester body in a polarity tester of the type described, whereby physical convenience in testing of lamp fixtures is maximized.

Briefly stated, in accordance with the present invention, there is provided a self-contained polarity tester which interfaces with a device, e.g. a lamp fixture, which device has a plug for receiving line power input and a socket for mechanical support of and power transmission to an active element such as a lamp. The tester comprises a polarized receptacle which receives the plug from the device. A probe maintained in a preselected spatial relationship to the tester body, is formed to be conveniently engageable with a socket and is operated to engage the socket. A circuit in the tester incorporates a low-level power source and a plurality of indicator devices. When a the probe engages the socket for connection to the tester circuit, the low level source is connected to energize one said indicator device dependent upon the polarity of the plug connection. A short circuit will cause both indicator devices to be energized, while an open circuit in the device will prevent energization of the indicator devices.

BRIEF DESCRIPTION OF THE DRAWINGS

The means by which the foregoing objects and features of invention are achieved are pointed out with particularity in the claims forming the concluding portion of the specification. The invention, both as to its organization and manner of operation may be further understood by reference to the following description taken in connection with the following drawings.

Of the drawings.

DESCRIPTION OF THE PREFERRED EMBODIMENTS

Figure 1:
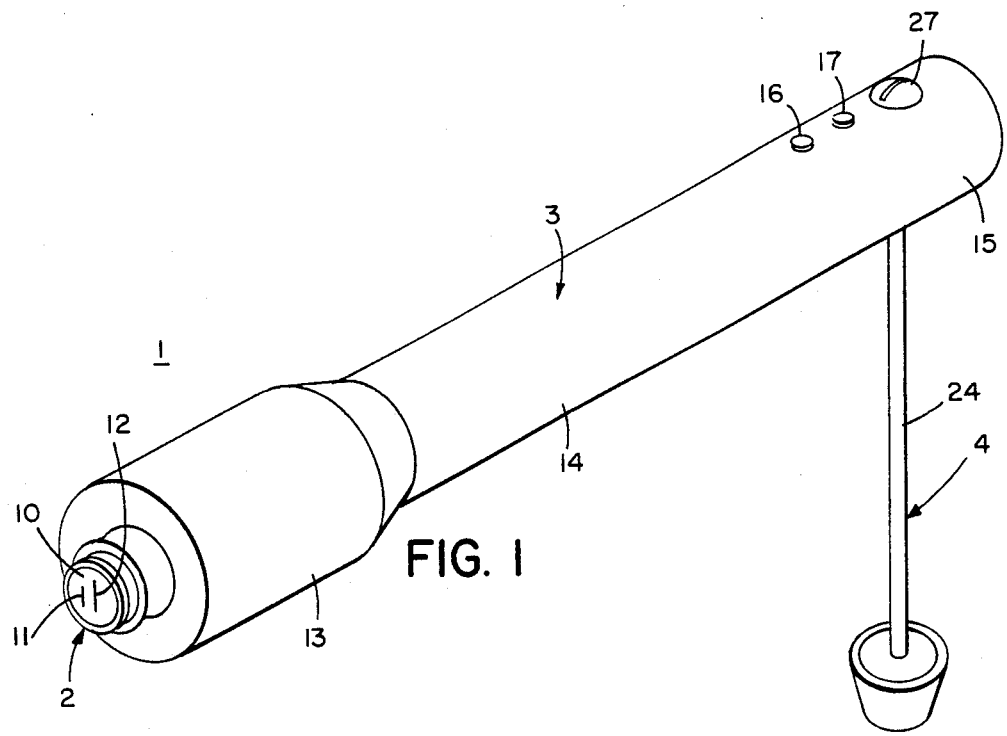
FIG. 1 is an axonometric view of a tester constructed in accordance with the present invention.

Referring now to FIG. 1, there is illustrated in axonometric form a polarity tester 1 constructed in accordance with the present invention. In all of the Figures herein, the same reference numerals are utilized to denote the same items. The polarity tester 1 comprises receptacle means 2 for a receiving a plug, housing 3 which encloses circuitry (discussed below with respect to FIG. 5) and carries probe assembly 4 for interconnecting with a device under test (illustrated in FIG. 6). The housing 3 may take any convenient form, and is preferably shaped to be hand held.

The receptacle means 2 comprises a socket 10 for receiving an ac plug in the preferred embodiment. The socket 10 could comprise other means in other embodiments so long as it is configured to receive a polarized connection from a device under test. The socket 10 comprises terminals 11 and 12 having openings of differing widths for receiving blades from a conventional polarized ac plug and having, in the interior of the socket 10, conventional copper contacts for mechanical coupling to a plug to provide the electrical interface illustrated in FIG. 5 below.

The housing 3 is preferably constructed of an insulating material such as plastic and may be of any shape suited to provide the functions below, namely housing appropriate circuitry, receiving inputs and providing for connection to the device under test. The illustrated embodiment comprises a first end section 13 comprising a right circular cylinder of a first diameter suitable for housing the plug 10 and the circuitry illustrated in FIG. 5, particularly a battery. A central portion 14 is of a reduced diameter with respect to the end portion 13 and projects axially away form the receptacle 2. Preferably the central portion 14 is of a diameter that is suited to be hand held.

At a remote end 15 of the housing 3, indicator means 16 and 17 are mounted for visibility by a user for respectively providing indications of proper or improper polarity, open circuit or a short circuit for the device under test. Most conveniently, the indicator means 16 and 17 will comprise light emitting diodes providing outputs of differing colors. Preferably, the probe means 4 project from the remote end 15 of the housing 3 so the placement of the probe means 4 can be conveniently manipulated by a user holding the central means 14 of the housing 3.

Figure 5:
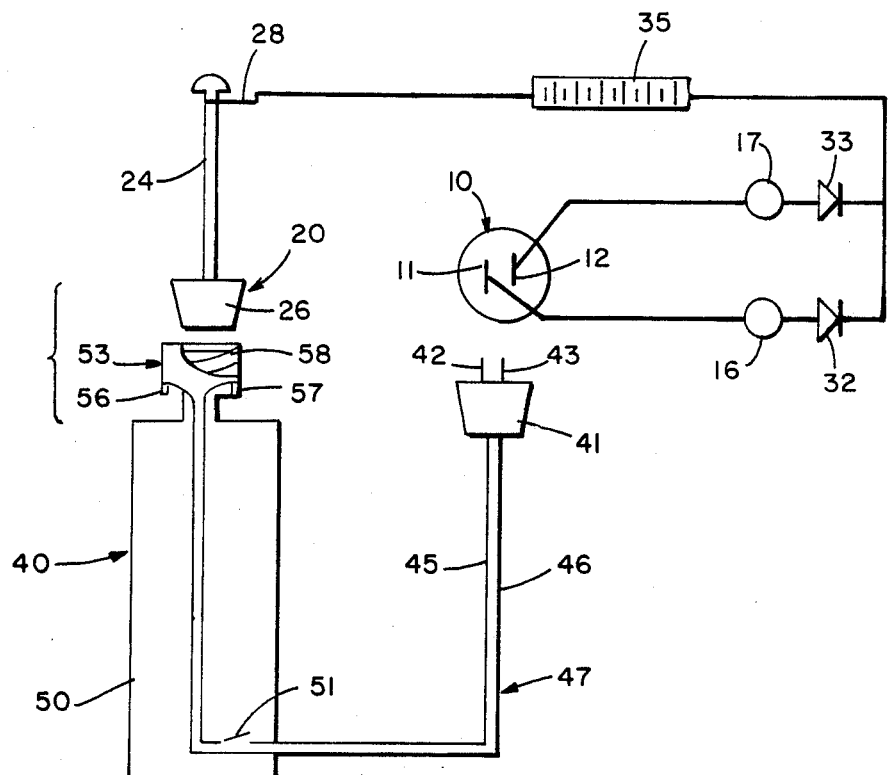
FIG. 5 is a schematic circuit diagram of the tester of FIGS. 1–3 and a device to be tested.
Figure 6:
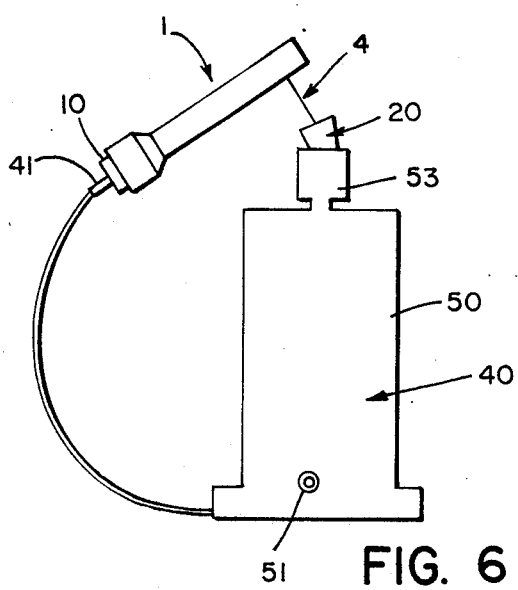
FIG. 6 is an illustration of the tester of the present invention in use.

The probe assembly 4 requires the inclusion of probe means 20 to transmit power to the device under test (FIG. 6). The probe means 20 most conveniently comprises a frusto-conical copper form 26. This form is well-suited for insertion into a lamp socket. Other shapes may also be used, and other conductors, e.g. aluminum, may also be used. The probe means 20 in the preferred form are disposed a preselected spatial relationship with the housing 3 in order to enhance the repeatability and, therefore, convenience of the operation to be performed by the used on the device under test. To this end the probe means 20 may be mounted to the housing 3 by means of a bolt 24 included a head 27 form with convenient means such as a thread for maintaining the bolt 24 in the housing 3. The probe means 20 may also be referred to as a probe of probe tip 20. A wire 28 connected to the probe means 20 provides a series connection to the circuitry (FIG. 5) inside the housing 3. The length of the bolt 24 is selected as a function of convenience to the user in the application of the tester 1 to devices under test. The bolt 24 could be bent or curved, and its shape may be described by a curve varying in any preselected number of degrees of freedom. The bolt 24 need not be rigid. It could be flexibly settable to a preset position or it may be spring biased. The bolt 24 could, for example, comprise a spring covered with a vinyl layer.

Figure 2:
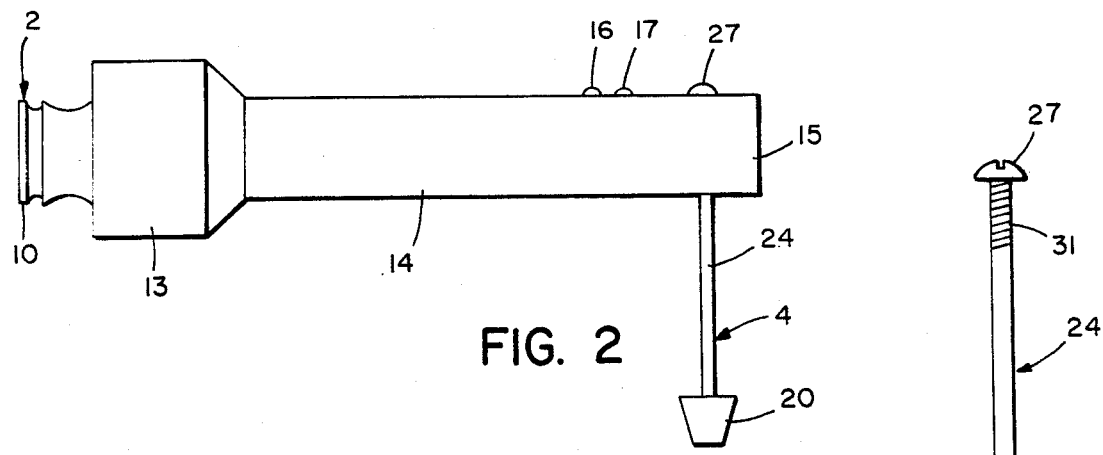
FIG. 2 is an elevation of the apparatus in FIG. 1.
Figure 3:
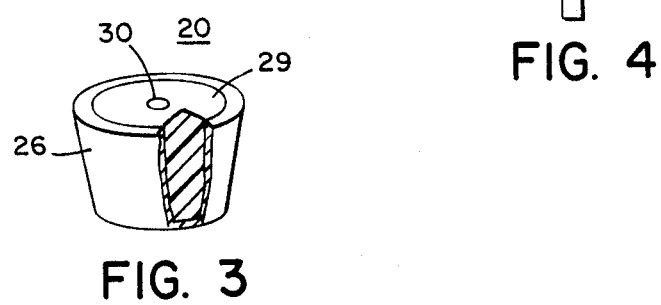
FIG. 3 is a detail, partially broken away of probe tip apparatus of FIGS. 1 and 2.

FIG. 3 is a detail of a portion of FIG. 2, partially broken away. The frusto-conical copper form 26 is mounted onto an elastomeric core 29 having central recess 30 for being conveniently threaded on the end of the bolt 24 remote from the housing 3. The wire 28 may be soldered to the bolt 24 which is conductive and fits at its lower end into the copper form 26. Other convenient forms of connection to the form 26 may be provided. This construction renders the probe means 20 modular with respect to the probe means 4. FIG. 3 is thus illustrative of a plurality of probe means 20 which may each be a different size and one in which is selected to be connected in the polarity tester 1. This feature enhance the utility of the invention since in the most commonly contemplated form of device under test, lamp sockets, there five different conventional sizes which may be encountered. The probe means 20 may be conveniently customized through use a modular probe form 26 to be adaptable to a selected size of lamp socket.

Figure 4:
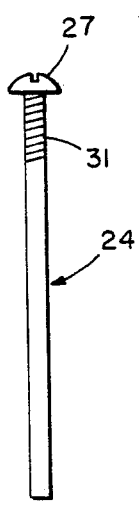
FIG. 4, is an illustration of a modular alternative probe assembly and tip which may be utilized in the polarity tester.

For further utility and convenience in operation, the probe assembly 4 is modular with respect to the polarity tester 1. Modularity allows the options of replacing a probe means 4 incorporating a straight bolt 24 with one bent at a preselected angle or replacing a rigid one with a spring-loaded one. In FIG. 4, the probe means 4 is illustrated in an elevation. The head 27 of the bolt 24 is illustrated having extending therefrom securing means 31 for securing the probe assembly 4 to the housing 3. In the present embodiment, the securing means 31 comprises a thread for mating with walls of the housing 3. The securing means 31 need not necessarily be embodied integrally within the bolt 24, but alternatively could comprise separate clamp means.

FIGS. 5 and 6 each illustrate the polarity tester 1 in use. The same reference numerals are used to denote the same elements. FIG. 5 is an electrical schematic illustration with an elevation of a device superimposed thereon with a socket partially broken away. FIG. 6 is an elevation. A series connection is provided from the terminal 11 to a first terminal of a light emitting diode 16 having its other terminal connected through a diode 32 to one side of a battery 35. Similarly, a light emitting diode 17 and a diode 32 are connected in series between the terminal 12 and the battery 30. The light emitting diodes 16 and 17 should preferable be red and green respectively. This choice of colors will provide for conventional indications of polarity, but of course, any colors may be chosen. The other side of the battery 35 is connected to the wire 28 for coupling to the probe means 20. A switch in series with the battery 35 is not required since the battery 35 is only connected in a closed circuit when testing is being performed.

The device 40 under test is a lamp fixture 40 having a plug 41 for connection to a conventional power outlet. For purposes of testing, the plug 41 is received in the socket 10 in the polarity tester 1. The present invention affords the opportunity to perform testing at battery current levels instead of line current. Blades 42 and 43 of the plug 41 are respectively received in terminals 11 and 12 of the socket 10. The blades 42 and 43 are connected respectively to wires 45 and 46 in line cord 47 which extends through a lamp body 50 for connection by a conventional on-off switch 51 to a lamp socket 53 supported to the lamp body 50. The wires 45 and 46 are respectively connected to lamp socket terminals 56 and 57 which provide first and second series connections to a lamp (not illustrated) for use in the lamp fixture 40. One terminal socket terminal is connected to a central terminal 56 which will connect to the conventional "button" electrode on a lamp base, and another terminal 58 is connected to the other lamp socket terminal 58 comprising a copper piece into which a lamp is commonly threaded. Terminal 57 is the terminal providing connection to what is often called a screw shell 58, seen in the partially broken away illustration of the lamp socket 53. An additional terminal may be present in lamp sockets 53 configured for three-way lamps. However, the terminals 56 and 57 will also be present and still function as described below.

In use as seen with respect to FIG. 6, a user inserts the plug 41 into the receptacle 10. The tester 1 is grasped, preferably by means of gripping the cylindrical portion 14. The tester 1 is manipulated so the the probe means 20 engages the screw shell 58. A series connection closing the circuit in FIG. 5 is achieved. If the blade 43 is wired to the screw shell 58, the probe means 20 and wire 28 will connect the light emitting diode 16. A red indication will be seen. However, if the blade 42 is wired to the screw shell 58 connecting the probe means 20 to the screw shell 58 will complete a series circuit with the light emitting diode, and a green indication will be provided.

In accordance with the present invention, the polarity testing operation also provides a test for an open or short circuit in the line cord 47. An open circuit will be indicated by the lack of illumination of either of the light emitting diodes 16 or 17. A short circuit in the device 40 will close the circuit to and result in illumination of both light emitting diodes 16 and 17.

The present invention provides for rapid, safe and convenient testing. After the plug 41 is inserted in the socket 10, tested may be completed with one hand. No clips or contacts need be manipulated to engage to the device 41 under test. No switches need be operated to perform the test. The probe assembly 4 can be configured for maximum convenience. For example, a user may set up a testing operation wherein the angle at which the tester 1 will be held may be selected for maximum comfort irrespective of the angle at which the probe means 4 will need to engage the screw shell 57. The selected angular relationship can be provided by inserting in the tester 1 a modular probe means 4 selected for that particular testing operation. The probe means 4 can also be selected to provide for any linear distance to be maintained between the user and the device under test. Because the probe tip 20 is modular as well, the same tester can be used on lamp fixtures having different socket sizes.

While the polarity tester of the present invention will in all likelihood be used primarily for testing lamp fixtures, it has utility for other devices in which a plug receives input power and transmits power through a socket to a powered device. The specification will enable those skilled in the art to construct many further forms of apparatus comprehended by the present invention.

What is claimed as new and desired to be secured by Letters Patent of the United States is:

1. Polarity testing apparatus for testing a device in the on state having a plug for receiving power input and socket means for transmission of power to a circuit element, said apparatus comprising: a housing, polarized receptacle means including first and second terminals and mounted or receiving the plug, probe means for engaging a contact of said socket means, at least first and second indicators each selected to correspond to one polarity and circuit means connecting each said indicator in series from said probe means to a different one of said terminals, whereby when the device is in the on state plugged into the receptacle means and said probe means engages the socket, one or the other of said indicators is connected in a series circuit with the device in correspondence with the polarity of the device and further whereby neither both of said indicators are connected to respond to a response short circuit in the device, said apparatus further comprising a probe assembly comprising said probe means and mounting means for maintaining said probe means in a preselected spatial relationship to said housing, and means for operating said indicator means connected in series with the device.

2. The apparatus according to claim 1 wherein said polarized receptacle means is mounted in a first end of said housing opposite from said probe assembly.

3. The apparatus according to claim 2 wherein said probe assembly is detachably mounted to said housing.

4. The apparatus according to claim 3 wherein said probe means comprises a probe including a frusto-conical copper form of minimum and maximum diameters selected for engagement with a preselected standard lamp socket base.

5. The apparatus according to claim 4 wherein said probe is removably mounted to said probe assembly, whereby a selected one of a plurality of probes, each proportioned to a different standard size lamp socket base may be selected for inclusion in said probe assembly.

6. The apparatus according to claim 5 wherein said mounting means for maintaining said probe means in a preselected spatial relationship to said housing comprises an elongated bolt with means at a first end for securing to said housing and means at an opposite end for mounting said probe means thereto.

7. The apparatus according to claim 6 wherein said indicators comprise light emitting diodes and said means for operating said indicator means comprises a battery connected between said indicators and said probe means.

8. A polarity tester comprising: a housing adapted to be hand-held, a polarized receptacle for receiving a plug from a device to be tested, a probe assembly including a probe and mounting means, said mounting means projecting from said housing and maintaining said probe in a predetermined spatial relationship such that positioning of the probe is effected by hand movement of a user of the polarity tester, said probe being utilized to engage a contact of a socket on the device, circuit means connected between said receptacle and said probe comprising first and second indicators each connected to a different one of contacts in said receptacle, and both connected in series with said probe, and means for energizing said indicators connected between said indicators and said probe, whereby when the device is plugged into said receptacle and said probe engages the contact one said indicator is operated in correspondence with the polarity of the device and wherein failure of either said indicator to operate is indicative of an open circuit in the device.

9. The polarity tester of claim 8 wherein said probe comprises a frusto-conical form on an elastomeric core received on mounting means comprising an elongated bolt.

10. The polarity tester of claim 9 wherein said indicator means comprise a red and a green light emitting diode and said means for operating comprises a battery mounted in said housing.

11. A method for testing a device in the on state having a plug for receiving a power input and socket means for transmission of power to a circuit element, said method comprising the steps of: providing a polarized receptacle in a tester with first and second indicators respectively connected to first and second terminals of said receptacle and providing a probe in said tester; connecting said plug into said polarized receptacle; mechanically engaging with and electrically connecting said probe to b contact of said socket means; and energizing a circuit comprising said device by connecting a source between said indicators and said probe, whereby one or the other of said indicators is connected in a series circuit with the device in correspondence with the polarity of the device and further whereby neither or both of said indicators is connected in response to an open circuit or short circuit respectively in the device.

12. The method of claim 11 wherein the step of mechanically engaging said probe with said socket comprises maintaining said probe in a fixed spatial relationship to said tester.

13. The method of claim 12 wherein the step of energizing comprises connecting a battery between said probe and said indicators.

14. The method according to claim 13 wherein the step of engaging comprises fitting said probe in said socket.

* * * * *